United States Patent
Macri

(10) Patent No.: US 7,564,737 B2
(45) Date of Patent: Jul. 21, 2009

(54) MEMORY DATA TRANSFER

(75) Inventor: Joseph D. Macri, San Francisco, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 141 days.

(21) Appl. No.: 11/847,749

(22) Filed: Aug. 30, 2007

(65) Prior Publication Data
US 2008/0080298 A1 Apr. 3, 2008

Related U.S. Application Data

(60) Provisional application No. 60/841,389, filed on Aug. 30, 2006.

(51) Int. Cl.
*G11C 8/00* (2006.01)

(52) U.S. Cl. ........................ 365/233; 365/194

(58) Field of Classification Search ................ 365/233, 365/194; 327/158
See application file for complete search history.

(56) References Cited

U.S. PATENT DOCUMENTS

| | | | |
|---|---|---|---|
| 6,815,990 B2 * | 11/2004 | Lee | 327/158 |
| 7,208,989 B2 * | 4/2007 | Deivasigamani et al. | 327/149 |
| 7,259,604 B2 * | 8/2007 | Gomm | 327/175 |

* cited by examiner

*Primary Examiner*—Son Dinh
(74) *Attorney, Agent, or Firm*—Courtney Staniford & Gregory LLP

(57) ABSTRACT

In one aspect, there is provided a method for controlling data output by a memory device. The method may include receiving a first clock signal having a first frequency. Moreover, a second and third clock signals may be produced from the first clock signal. The second and third clock signals may have second and third frequencies, respectively, that are about equal to the first frequency. The second and third frequencies may be out of phase relative to each other. A controller may output a first data in response to a rising edge of the second clock signal and output a second data in response to another rising edge of the third clock signal.

17 Claims, 3 Drawing Sheets

MEMORY DATA TRANSFER

CROSS-REFERENCE TO RELATED APPLICATION

This application claims the benefit under 35 U.S.C. Section 119(e) of the following: U.S. Provisional Patent Application No. 60/841,389, entitled "MEMORY DATA TRANSFER," filed Aug. 30, 2006, which is incorporated by reference herein.

BACKGROUND

Interactions between computer processing units and computer memories are regulated by triggering events. The triggering events may be the rising edge, the falling edge, and the rising and falling edges of a clock. For example, double data rate (DDR) dynamic random access memory (DRAM) chips have been made using both rising and falling edges of a delay lock loop (DLL) clock signal to trigger data transfers from the DRAM.

SUMMARY

The subject matter disclosed herein provides systems and methods for controlling a memory data transfer from a memory device, such as DDR DRAM, to another device.

In one aspect, there is provided a method for controlling data output by a memory device. The method may include receiving a first clock signal having a first frequency. Moreover, second and third clock signals may be produced from the first clock signal. The second and third clock signals may have second and third frequencies, respectively, that are about equal to the first frequency. The second and third clock signals may be out of phase relative to each other. A controller may output, in response to a rising edge of the second clock signal, a first data and output, in response to a rising edge of the third clock signal, a second data.

Various aspects of embodiments of the invention may provide one or more of the following capabilities. A delay lock loop clock generator may be coupled to the controller and produce the second and third clock signals. Moreover, the second and third clock signals may be generated, such that they are out of phase relative to each other by about 180°. The first clock signal may be received from the memory device. The data may be received from a memory device. The first data may be saved, based on a rising edge of the second clock signal, using a D-type flip-flop. The second data may be saved, based on a rising edge of a third clock signal, using a D-type flip-flop. A Double Data Rate (DDR) Dynamic Random Access Memory (DRAM) may be used as the memory device.

It is to be understood that both the foregoing general description and the following detailed description are exemplary and explanatory only and are not restrictive. Further features and/or variations may be provided in addition to those set forth herein. For example, the implementations described herein may be directed to various combinations and subcombinations of the disclosed features and/or combinations and subcombinations of several further features disclosed below in the detailed description.

DETAILED DESCRIPTION

Figure 1:
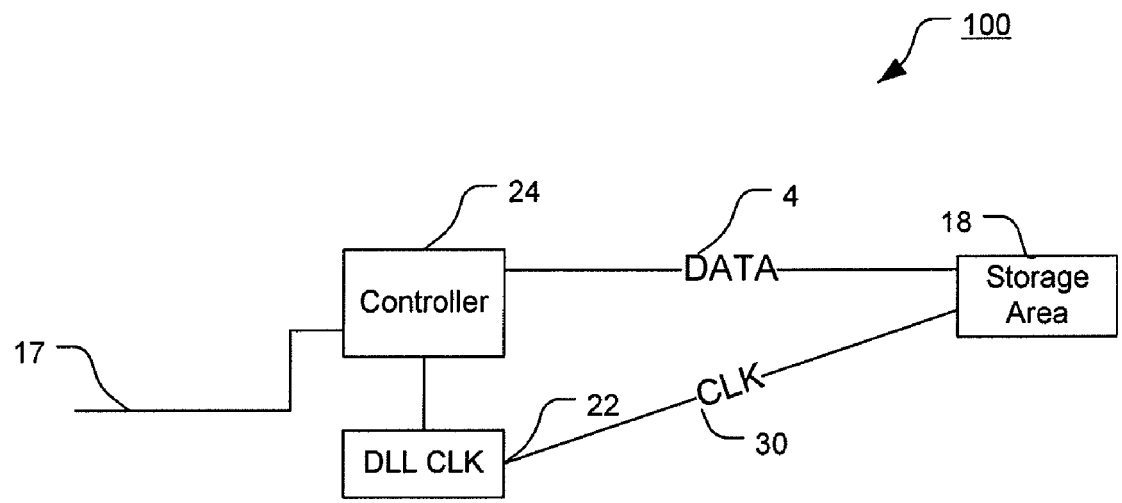
FIG. 1 is a simplified block diagram of a system including a controller, a storage device (e.g., a DDR DRAM), and a DLL clock generator.

FIG. 1 depicts a system 100 including a storage area 18 (e.g., a DRAM chip, a DDR DRAM, and the like), a controller 24, and a delay lock loop (DLL) clock generator 22. The storage area 18 provides data 4 to controller 24 and provides a clock signal (also referred to as a clock) 30 to DLL clock generator 22. The storage area 18 provides data 4 to controller 24 on the falling edge and the rising edge of a clock, such as clock signal 30.

Figure 2:
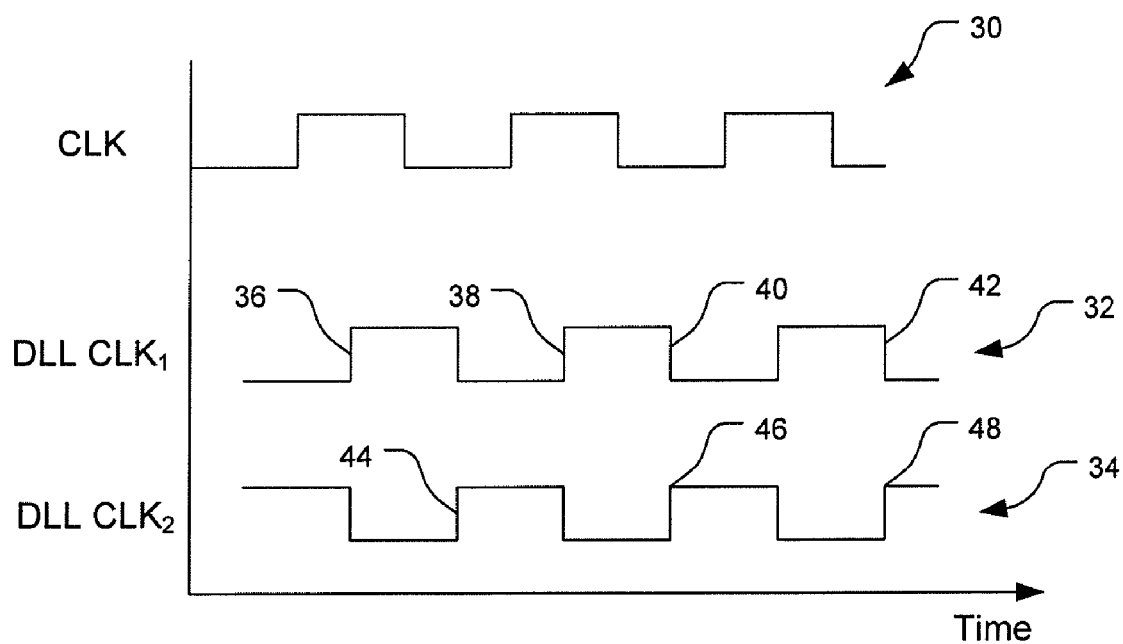
FIG. 2 is a timing diagram including two DLL clock signals produced by the DLL clock generator shown in FIG. 1.

The DLL clock generator 22, coupled to storage area 18, receives clock 30 and generates a first clock signal 32 and a second clock signal 34, both of which are depicted at FIG. 2. The DLL clock generator 22 provides first clock 32 and second clock 34 to controller 24. The controller 24 uses only the rising edges, such as rising edge 36, to trigger a save (e.g., a latch) of a first data value of data 4. The controller 24 also uses the rising edge 44 to trigger a save of a second data value of data 4. The latched first and second data values are then provided as a data output 17 of controller 24. In some implementations, clock signals 30, 32, and 34 have about the same frequency.

The DLL clock generator 22 is configured to provide clock signals, such as clock signals 32 and 34, to controller 24. Referring again to FIG. 2, clock (CLK) signal 30 is provided to DLL clock generator 22. The DLL clock generator 22 is configured to phase shift (e.g., by delaying) the clock signal 30 to produce a first clock signal 32 and a second clock signal 34. The second clock signal 34 is phase shifted relative to the first clock signal 32. In some implementations, the phase shift is about 180° (degrees); while in other implementations, other phase shift values may be used as well. As used herein, about 180° refers to a value understood to be substantially equal to 180°. For example, a phase shift value of 160° may, in some implementations, be considered substantially equal to 180°. Moreover, in some implementations, the phase shift value of 180° may vary by plus or minus 20° (degrees), such that the data value latched by the D-type flip-flop has equal setup and hold time relative to the first and second clock signals. Although the subject matter described herein refers to a DLL clock generator, any other type of clock generator capable of generating clock signals 32 and 34 may be used as well.

The controller 24 is configured to receive data from the storage area 18. The controller 24 also provides, in response to the rising edges 36-46, output data 17. In some implementations, controller 24 is implemented as a memory controller for a DDR DRAM, although controller 24 may be used as a controller for any other memory device as well. Moreover, although controller 24 is depicted as separate from the other components of system 100, in some implementations, controller 24 may be implemented at other locations as well.

In some implementations, controller 24 includes a D-type flip-flop device to latch (i.e., save) data 4, when the rising edges 36-46 trigger the D-type flip-flop to save a sample value of data 4. The controller 24 may also include command lines and address lines (not shown) to access and thus receive data 4 from storage area 18.

The storage device 18 may be implemented as any type of memory including, DRAM, DDR DRAM, SDRAM (synchronous dynamic random access memory), and the like. In some implementations, storage area 18 includes a clock generator for providing clock 30; while in other implementations, that clock generator is external to storage area 18. Although not shown, storage area 18 may be coupled to address lines and/or command lines from controller 24 to enable specific portions of storage area 18 to be addressed and provided (e.g., as data 4).

Figure 3:
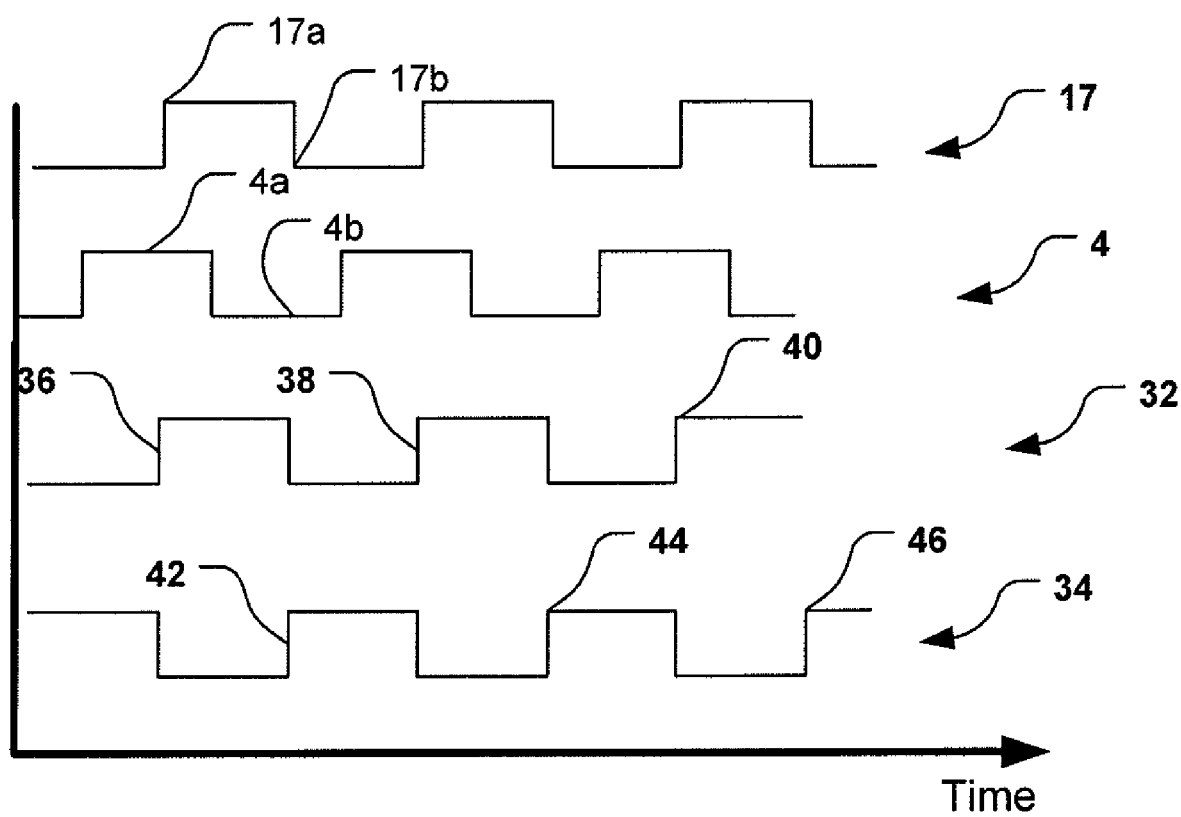
FIG. 3 is a timing diagram of the two DLL clock signals, data input to a controller, and data output by a controller.

FIG. 3 depicts data output 17 by controller 24, data 4 received by controller 24, and clock signals 32 and 34. The rising edge, such as rising edge 36 of clock 32, triggers a save at controller 24 (e.g., by a D-type flip-flop) of the value 4a of data 4, which results in a first data 17a. Next, rising edge 42 of clock 34 triggers a save at controller 24 of the value 4b, which results in a second data 17b. This process of triggering and saving based on the rising edges of the clock signals 32 and 34 provided by DLL clock 22 may be repeated.

Figure 4:
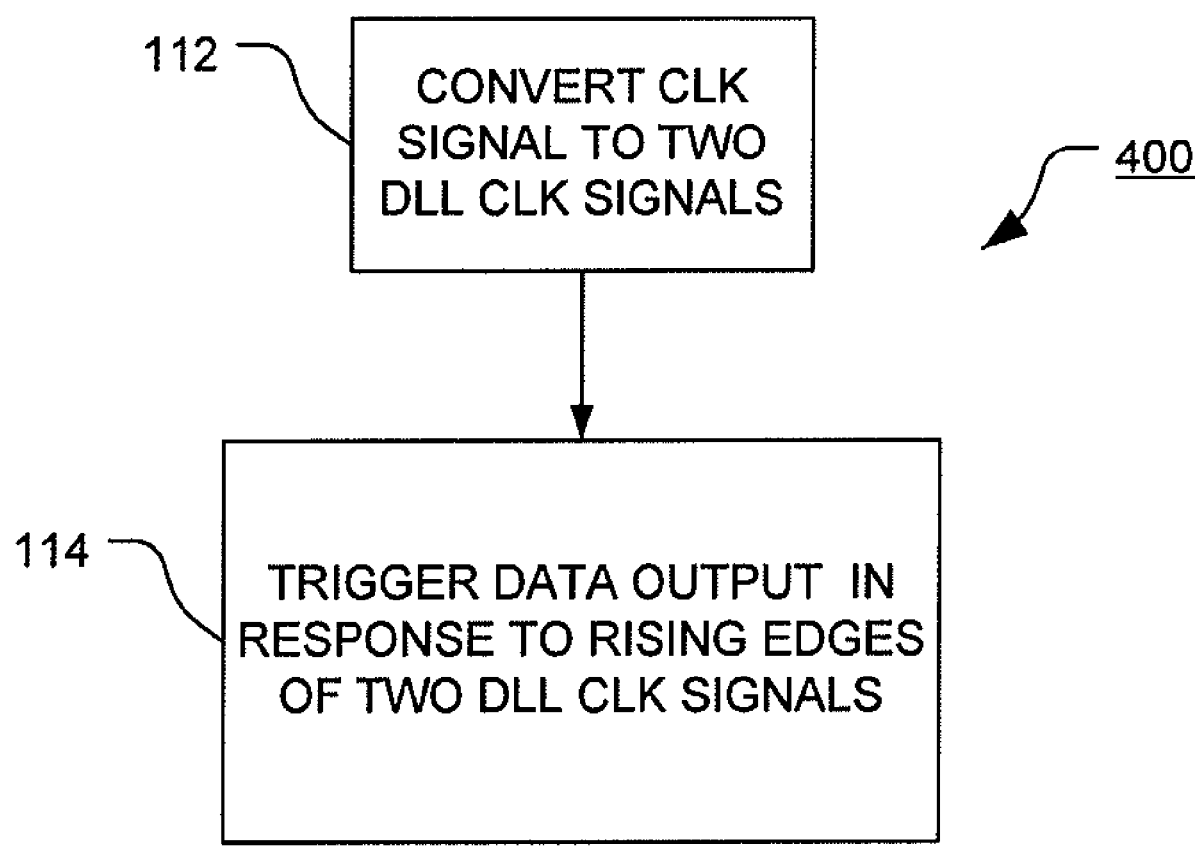
FIG. 4 is a block flow diagram of a process for controlling the transfer of data from a memory chip.

FIG. 4 depicts a process 400 for controlling the transfer of data to/from a storage device, such as a memory chip, a DDR DRAM, or the like. The process 400 includes the stages shown at FIG. 4. The process 400, however, is exemplary only and not limiting. The process 400 may be altered, e.g., by having stages added, removed, or rearranged.

At stage 112, clock signal 30 is converted into the two clock signals 32, 34. The DLL clock generator 24 may receive clock signal 30, which in some cases is produced by a clock generator (not shown) associated with storage area 18. The DLL clock generator 22 uses clock signal 30 to produce clock signals 32, 34. In some implementations, DLL clock generator 22 uses clock signal 30 to produce clock signals 32, 34, with clock signal 32 phase shifted about 90° relative to clock signal 30, and clock signal 34 phase shifted about 180° relative to clock signal 32. The DLL clock generator 22 provides clock signals 32, 34 to controller 24.

At stage 114, controller 24 uses clock signals 32, 34 to control the triggering of data transfers. The controller 24 controls, based on rising edges 36-46 (which triggers D-type flip-flops to sample data 4), the output data 17. The controller 24 thus controls the data transfer from storage area 18 to another device, which may be coupled to output 17. In some implementations, the output data 17 is transferred (from storage device 18) at twice the rate, when compared to using only the rising edges of the clock signal 30.

The foregoing description is intended to illustrate but not to limit the scope of the invention, which is defined by the scope of the appended claims. Other embodiments are within the scope of the following claims. For example, phase shifts other than 180° between the signals 32, 34 may be used as well. Moreover, although controller 24 and storage area 18 are depicted as separate, in some implementations storage area 18 and controller 24 may be implemented on the same device. In addition, the lines linking the components of FIG. 1 may be implemented as one or more lines capable of carrying a signal. While reference is made above to "the invention," more than one invention may be disclosed.

What is claimed is:

1. A method for controlling data output by a memory device, the method comprising:
    receiving, at a clock generator coupled to a controller, a first clock signal having a first frequency;
    producing, at the clock generator, a second and third clock signals from the first clock signal, the second and third clock signals having second and third frequencies, respectively, that are substantially equal to the first frequency, the second and third clock signals being out of phase relative to each other; and
    outputting, at the controller, a first data in response to a rising edge of the second clock signal and a second data in response to another rising edge of the third clock signal.

2. The method of claim 1 further comprising:
    using a delay lock loop clock generator, coupled to the controller and to the memory device, for producing the second and third clock signals from the first clock signal received from the memory device.

3. The method of claim 1 further comprising:
    generating the second and third clock signals out of phase relative to each other by about 180° (degrees).

4. The method of claim 1 further comprising:
    receiving the first clock signal from the memory device.

5. The method of claim 1 further comprising:
    receiving data from the memory device.

6. The method of claim 5 further comprising:
    saving, based on the rising edge of the second clock signal, the first data, the first data saved using a D-type flip-flop.

7. The method of claim 5 further comprising:
    saving, based on the other rising edge of the third clock signal, the second data, the second data saved using a D-type flip-flop.

8. The method of claim 1 further comprising:
    using a Double Data Rate (DDR) Dynamic Random Access Memory (DRAM) as the memory device.

9. A system comprising:
    a clock generator for producing, from a first clock signal, a second clock signal and a third clock signal, the second and third clock signals having second and third frequencies, respectively, that are substantially equal to the first frequency, the second and third clock signals being out of phase relative to each other; and
    a controller for outputting, in response to a rising edge of the second clock signal, a first data and for outputting, in response to another rising edge of the third clock signal, a second data.

10. The system of claim 9 further comprising:
    a memory device, coupled to the controller, for providing the first clock signal and for providing data from which the first and second data are sampled.

11. The system of claim 9, wherein the clock generator further comprises:
    a delay lock loop clock generator.

12. The system of claim 9, wherein the clock generator further comprises:
    generating the second and third clock signals to be out of phase relative to each other by about 180° (degrees).

13. The system of claim 9 further comprising:
    receiving the first clock signal from a memory device.

14. The system of claim 9 further comprising:
    receiving data from a memory device.

15. The system of claim 14 further comprising:
    a D-type flip-flop for saving, based on the second clock signal, the first data.

16. The method of claim 15 further comprising:
    a D-type flip-flop for saving, based on the third clock signal, the second data.

17. The method of claim 1 further comprising:
    a Double Data Rate (DDR) Dynamic Random Access Memory (DRAM) coupled to the controller.

* * * * *

UNITED STATES PATENT AND TRADEMARK OFFICE
CERTIFICATE OF CORRECTION

PATENT NO. : 7,564,737 B2  
APPLICATION NO. : 11/847749  
DATED : July 21, 2009  
INVENTOR(S) : Joseph D. Macri Page 1 of 1

It is certified that error appears in the above-identified patent and that said Letters Patent is hereby corrected as shown below:

In the Claims:

Column 4, line 33, claim 9 - before the word "first", change "the" to --a--.

Signed and Sealed this  
Nineteenth Day of April, 2011

David J. Kappos  
*Director of the United States Patent and Trademark Office*